(12) United States Patent
Zhou

(10) Patent No.: US 8,642,892 B2
(45) Date of Patent: Feb. 4, 2014

(54) CIRCUIT BOARD WITH HANDLES

(75) Inventor: Hai-Qing Zhou, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 99 days.

(21) Appl. No.: 13/235,451

(22) Filed: Sep. 18, 2011

(65) Prior Publication Data

US 2013/0048343 A1 Feb. 28, 2013

(30) Foreign Application Priority Data

Aug. 25, 2011 (CN) .......................... 2011 1 0245700

(51) Int. Cl.
*H05K 1/03* (2006.01)

(52) U.S. Cl.
USPC .......................................... 174/255; 361/807

(58) Field of Classification Search
None
See application file for complete search history.

(56) References Cited

U.S. PATENT DOCUMENTS 6,259,032 B1 * 7/2001 Fernandez ................ 174/138 E
6,762,944 B2 * 7/2004 Mizusaki ...................... 361/804

* cited by examiner

*Primary Examiner* — Ishwarbhai B Patel
(74) *Attorney, Agent, or Firm* — Altis Law Group, Inc.

(57) ABSTRACT

The circuit board includes a main body, at least one handle, and at least one connecting element. The main body defines at least one through hole. One end of each of the at least one handle defines a positioning portion. The positioning portion of each of the at least one handle extends through a corresponding one of the at least one through hole and is engaged with one of the at least one connecting elements.

5 Claims, 4 Drawing Sheets

CIRCUIT BOARD WITH HANDLES

BACKGROUND

1. Technical Field

The disclosure relates to circuit boards and, more particularly, to a circuit board with handles.

2. Description of Related Art

With computers becoming ever smaller, space inside the computers is at a premium, making it difficult to remove and install parts. For example, to remove a circuit board from a computer, the circuit board must be directly grasped and wrestled out through a small access hole, which can result in the board being flexed and components on the board damaged.

Therefore, what is needed is a circuit board to overcome the described shortcoming.

DETAILED DESCRIPTION

Figure 1:
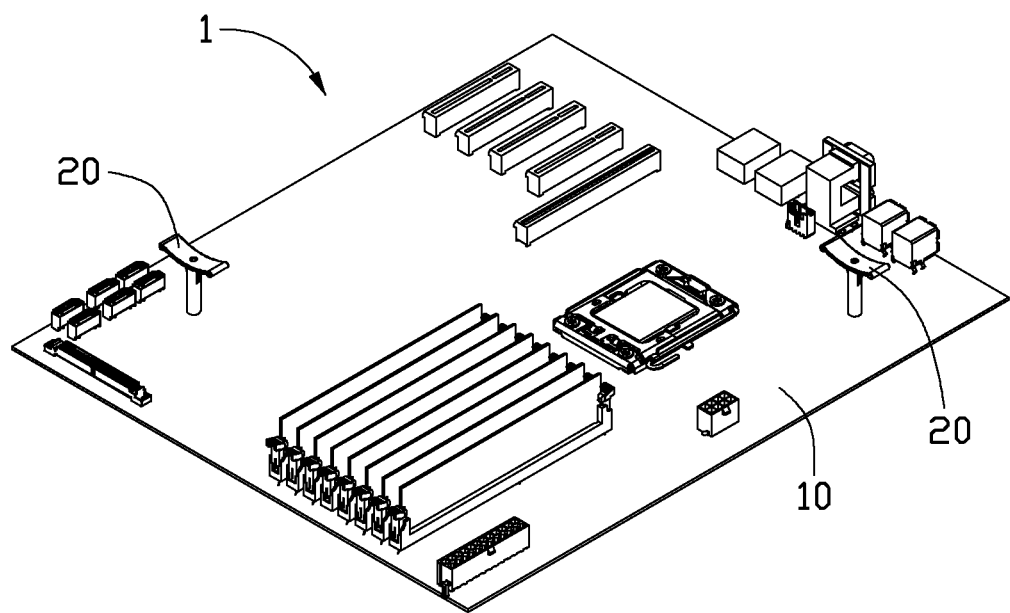
FIG. 1 is a perspective view of a circuit board with handles, in accordance with an exemplary embodiment.
Figure 2:
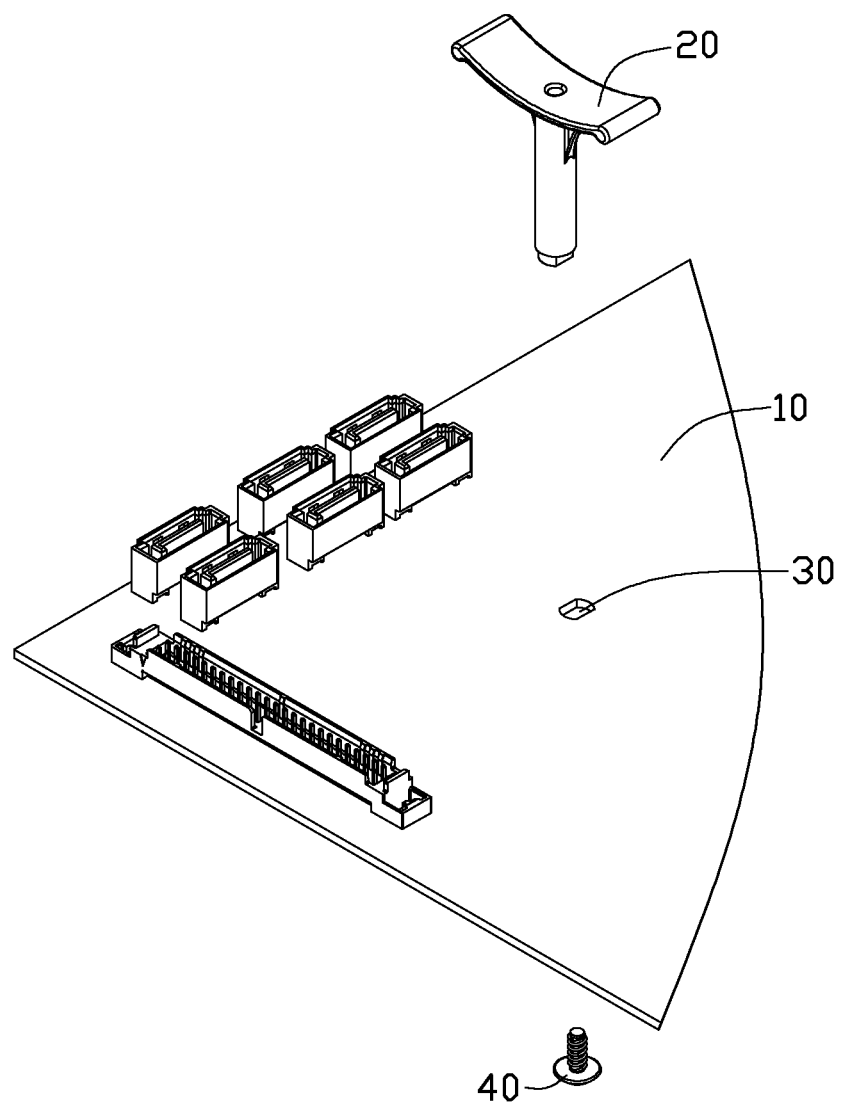
FIG. 2 is a partial, perspective view of the circuit board of FIG. 1, with one of the handles disassembled.

Referring to FIGS. 1-2, a circuit board 1 includes a main body 10, at least one handle 20, and at least one connecting element 40. The main body 10 is a board with a number of signal lines, such as a main board of a computer. There are equal numbers of the handles 20 and the connecting elements 40. In the embodiment, there are two handles 20 and two connecting elements 40. The handles 20 are fixed on the body 10 and can be grasped to manipulate the circuit board 1, such as when removing the board 1 from a housing (not shown). In the embodiment, the handles 20 are fixed in a diagonal line of the body 10.

The body 10 defines at least one through hole 30 at an appropriate position where no signal line is laid out. There are as many through holes 30 as the number of the handles 20. Each handle 20 extends through a corresponding through hole 30 and is engaged with a corresponding connecting element 40, therefore, the handles 20 are steadily fixed on the body 10 without interfering with the signal lines.

Figure 3:
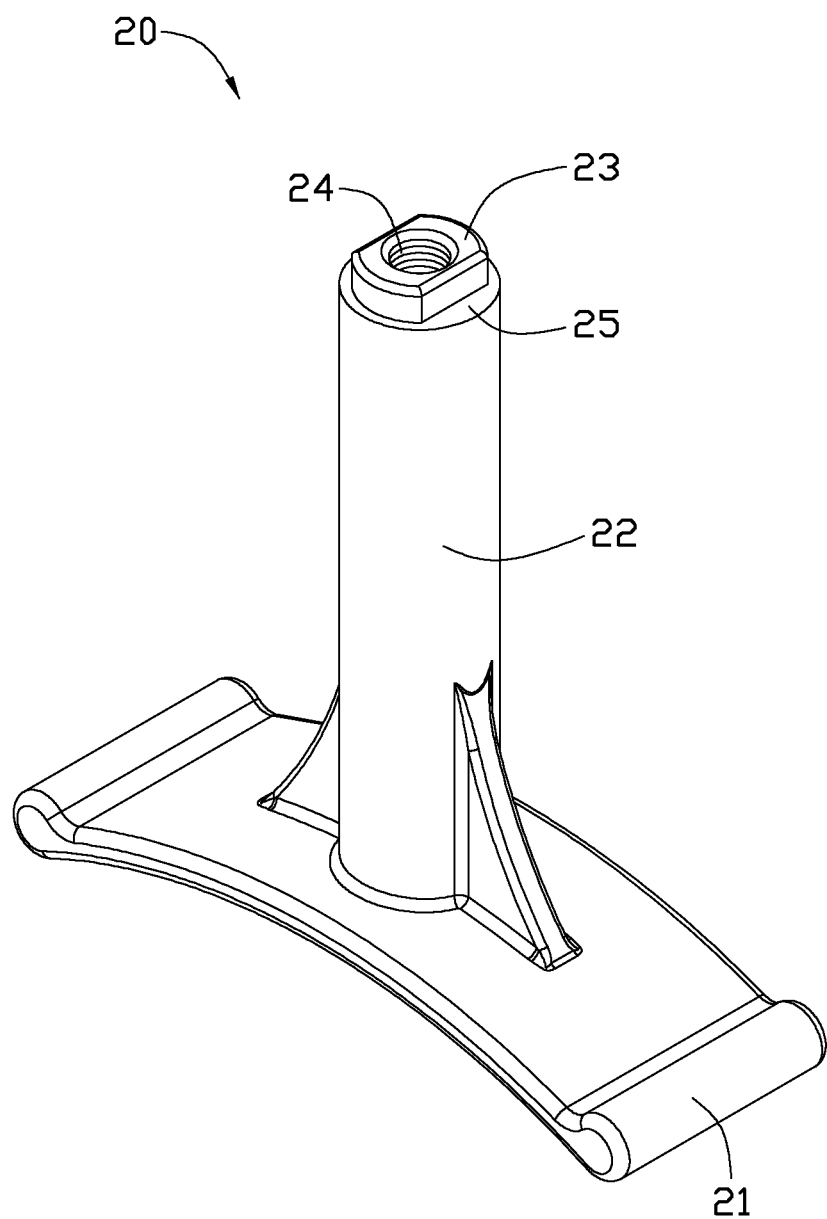
FIG. 3 is an enlarged perspective view of one of the handles of FIG. 1.
Figure 4:
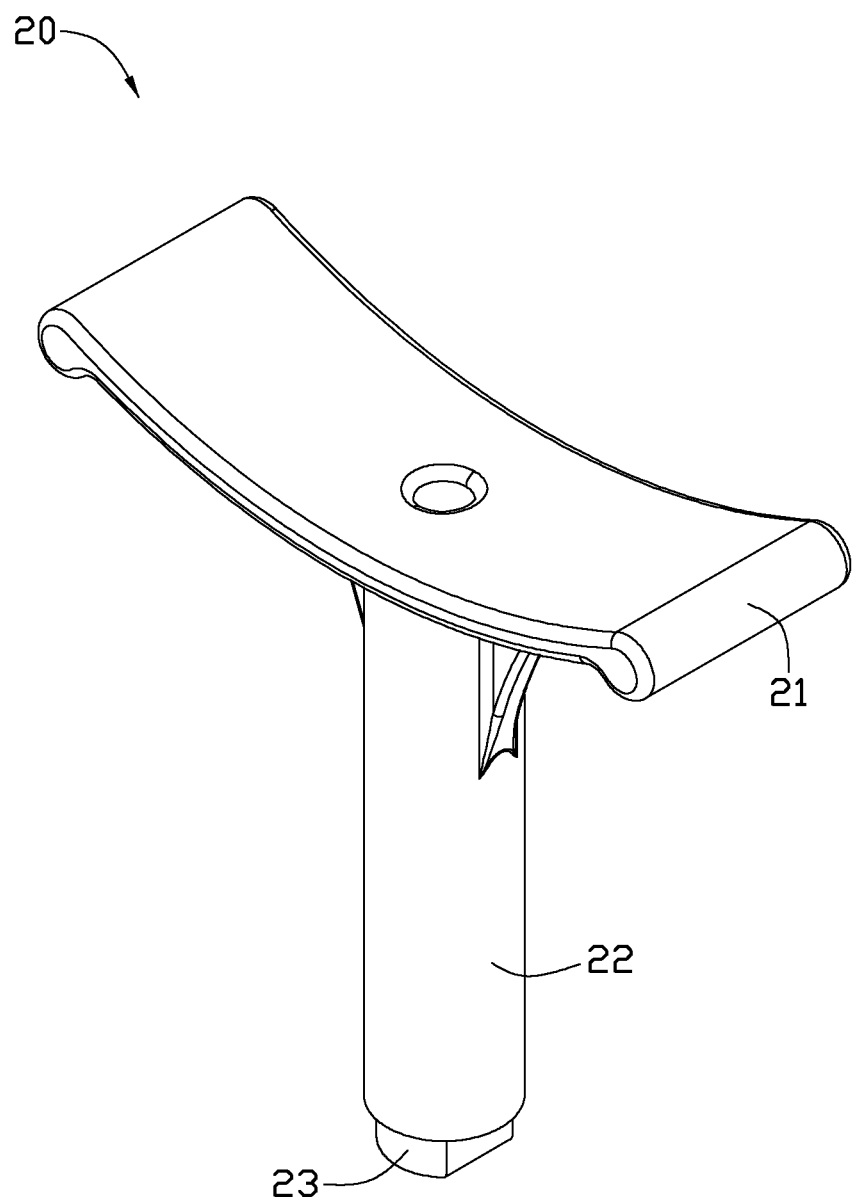
FIG. 4 is similar to FIG. 3 but from a different perspective.

Referring to FIGS. 3-4, each handle 20 is "T" shaped. A top 21 of each handle 20 is curved to be easily grasped. A supporting element 22 extends from the top of each handle 20. In the embodiment, the supporting elements 22 are cylindrical. One end of each supporting element 22 defines a positioning portion 23. The positioning portions 23 extend through the corresponding through holes 30 and are engaged with the corresponding connecting elements 40.

In the embodiment, each positioning portion 23 defines an internally threaded blind hole 24. The connecting elements 40 are screws that fit the blind holes 24. The heads of the screws 40 are made of rubber. In assembly, each positioning portion 23 extends through the corresponding through hole 30 and the corresponding screw 40 is screwed into the positioning portion 23. The size of the positioning portion 23 is smaller than a size of the supporting element 22, therefore, a step 25 is formed between the positioning portion 23 and the supporting element 22. The step 25 can abut the surface of the circuit board 1 when the handle 20 is assembled to the circuit board 1 through the through hole 30. Furthermore, the positioning portion 23 and the through hole 30 are double-D shaped to prevent rotation of the handle 20.

In another embodiment, the external surface of one end of the positioning portion 23 forms outer screw threads. The connecting element 40 is a nut. In assembly, each positioning portion 23 extends through the corresponding through hole 30 and the positioning portion 23 is screwed into the nut 40.

With such configuration, the handles 20 are fixed on the circuit board 1 without interfering with the signal lines of the body 10. Therefore, the user can easily take the circuit board 1 out from the housing by the handles and avoiding damaging components of the circuit board 1.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A circuit board comprising:
a main body defining at least one through hole;
at least one handle, one end of each of the at least one handle defining a positioning portion; and
at least one connecting element;
wherein the positioning portion of each of the at least one handle extends through a corresponding one of the at least one through hole and is engaged with one of the at least one connecting elements, the positioning portion of each of the at least one handle defines an internally threaded blind hole, each of the at least connecting element is a screw that fits the blind hole, and the positioning portion extends through the corresponding through hole and the corresponding screw is screwed into the positioning portion, a supporting element extends from the positioning portion, a size of the positioning portion of each of the at least one handle is smaller than a size of the supporting element, a step is formed between the positioning portion and the supporting element, and the step abut a surface of the main body when the handle is assembled to the main body through the corresponding through hole, and, the positioning portion and the corresponding through hole are double-D shaped to prevent rotation of the handle.

2. The circuit board as recited in claim 1, wherein a top of each of the at least one handle is curved.

3. The circuit board as recited in claim 1, wherein the number of the at least one handle is two.

4. The circuit board as recited in claim 3, wherein the two handles are fixed in a diagonal line of the body.

5. The circuit board as recited in claim 1, wherein each of the at least one handle is "T" shaped.

* * * * *